(12) United States Patent
Angelopoulos et al.

(10) Patent No.: US 6,653,045 B2
(45) Date of Patent: Nov. 25, 2003

(54) RADIATION SENSITIVE SILICON-CONTAINING NEGATIVE RESISTS AND USE THEREOF

(75) Inventors: Marie Angelopoulos, Cortlandt Manor, NY (US); Ari Aviram, Croton-on-Hudson, NY (US); Wu-Song Huang, Poughkeepsie, NY (US); Ranee W. Kwong, Wappingers Falls, NY (US); Robert N. Lang, Pleasant Valley, NY (US); Qinghuang Lin, Yorktown Heights, NY (US); Wayne M. Moreau, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 09/785,609

(22) Filed: Feb. 16, 2001

(65) Prior Publication Data

US 2002/0115017 A1 Aug. 22, 2002

(51) Int. Cl.$^7$ .............................................. G03F 7/004
(52) U.S. Cl. ..................................... 430/270.1; 430/905
(58) Field of Search ............................... 430/270.1, 905

(56) References Cited

U.S. PATENT DOCUMENTS

| 5,296,332 A | 3/1994 | Sachdev et al. ............ 430/270 |
| 6,043,003 A | 3/2000 | Bucchignano et al. ...... 430/326 |
| 6,087,064 A | 7/2000 | Lin et al. ................. 430/270.1 |
| 6,420,088 B1 * | 7/2002 | Angelopoulos et al. .. 430/272.1 |

FOREIGN PATENT DOCUMENTS

| JP | 5-181280 | * | 7/1993 |

OTHER PUBLICATIONS

Derwent abstract of JP 5–181280, Jul. 1993.*
JP office website English translation of JP 5–181280, Jul. 1993.*

* cited by examiner

*Primary Examiner*—Rosemary Ashton
(74) *Attorney, Agent, or Firm*—Connolly Bove Lodge & Hutz LLP; Steven Capella

(57) ABSTRACT

A negative resist composition, comprising:
(a) silicon-containing polymer with pendant fused moieties selected from the group consisting of fused aliphatic moieties, homocyclic fused aromatic moieties, and heterocyclic fused aromatic and sites for reaction with a crosslinking agent,
(b) an acid-sensitive crosslinking agent, and
(c) a radiation-sensitive acid generator is provided. The resist composition is used to form a patterned material layer in a substrate.

16 Claims, No Drawings

RADIATION SENSITIVE SILICON-CONTAINING NEGATIVE RESISTS AND USE THEREOF

TECHNICAL FIELD

The present invention relates to high-performance radiation sensitive resist compositions and their use in lithography processes to fabricate semiconductor devices. Specifically, the present invention is concerned with negative-tone silicon-containing resist compositions based on an acid catalyzed crosslinking of certain silicon-containing polymers. The resist composition of the present invention can be used to fabricate semiconductor devices using various irradiation sources, such as mid-ultraviolet (UV), deep-UV (for example 248 nm, 193 nm and 157 nm), extreme UV, X-ray, electron-beam and ion-beam irradiation. The resist compositions of the present invention exhibit enhanced sensitivity to e-beam and i-line irradiation along with resistance to high etch resistance to reactive ion etching in the presence of oxygen and chlorine. Compositions of the present invention are developable in aqueous base compositions.

BACKGROUND OF THE INVENTION

In the manufacture of patterned devices such as semiconductor chips and chip carriers the steps of etching different layers, which constitute the finished product are among the most critical and crucial steps involved.

In semiconductor manufacturing, optical lithography has been the main stream approach to pattern semiconductor devices. In typical prior art lithography processes, UV light is projected onto a silicon wafer coated with a layer of photosensitive resist through a mask that defines a particular circuitry pattern. Exposure to UV light, followed by subsequent baking, induces a photochemical reaction, which changes the solubility of the exposed regions of the photosensitive resist. Thereafter, an appropriate developer, typically an aqueous base solution, is used to selectively remove the resist either in the exposed regions (positive-tone resists) or, in the unexposed region (negative-tone resists). The pattern thus defined is then imprinted on the silicon wafer by etching away the regions that are not protected by the resist with a dry or wet etch process.

The current state-of-the-art optical lithography uses DUV irradiation at a wavelength of 248 nm to print features as small as 250 nm in volume semiconductor manufacturing. The continued drive for the miniaturization of semiconductor devices places increasingly stringent requirements for resist materials, including high resolution, wide process latitude, good profile control and excellent plasma etch resistance for image transfer to substrate. Several techniques for enhancing the resolution, such as reduced irradiation wavelength (from 248 nm to 193 nm), higher numerical aperture (NA) of the exposure systems, use of alternate masks or illumination conditions, and reduced resist film thickness are currently being pursued. However, each of these approaches to enhance resolution suffers from various tradeoffs in process latitude, subsequent substrate etching and cost. For example, increasing NA of the exposure tools also leads to a dramatic reduction in the depth of focus. The reduction in the resist film thickness results in the concomitant detrimental effect of decreased etch resistance of the resist film for substrate etching. This detrimental effect is exasperated by the phenomenon of etch induced microchannel formation during substrate etch, effectively rendering the top 0.2–0.3 um resist film useless as an etch mask for substrate etching.

Achieving further miniaturization would be facilitated by providing resists that exhibit enhanced sensitivity to e-beam and e-beam irradiation. However, obtaining resists that are sensitive to e-beam and i-line as well as being highly resistant to plasma and reactive ion etching is not an easy task. This is further complicated if a water developable system instead of an organic solvent developable system is desired.

Most lithographic processes (excluding so-called direct-write techniques) typically employ some type of patterned mask through which the imaging radiation is projected onto the resist material to be patterned on the substrate of interest. Typically, the mask itself is formed by a lithographic technique such as direct-write electron beam lithography or in some instances by projection UV lithography (especially i-line or deep UV) using an appropriate resist material. Typically, the mask comprises a patterned metal layer(s) (e.g., chromium) on a quartz plate (or other transparent plate).

A resist composition must possess desirable radiation response characteristics to enable image resolution upon exposure to a desired radiation development. Thus, a patternwise exposed positive resist must be capable of appropriate response (i.e. selective dissolution of exposed areas) to a developer to yield the desired resist structure. Given the extensive experience in the lithographic arts with the use of aqueous alkaline developers, it is important to achieve appropriate dissolution behavior in such commonly used developer solutions.

The resist composition must also possess suitable chemical and mechanical properties to enable transfer to the image from the patterned resist to an underlying substrate layer(s). Typically, pattern transfer is performed by some form of wet chemical etching or ion etching. The ability of the patterned resist layer to withstand the pattern transfer etch process (i.e., the etch resistance of the resist layer) is an important characteristic of the resist composition. In the case of typical mask making processes, a chlorine-containing etchant such as combination of $Cl_2$ and $O_2$ is generally a preferred etchant. Halogen-based etchants other than fluorine (i.e., Cl, Br, or I) are also preferred etchants for patterning metals and semiconductor (e.g., polycrystalline silicon) materials.

With demands for finer detailed masks and patterned metals/semiconductor materials, the performance of higher atomic weight halogen-based (i.e., Cl, Br, or I) etching processes has been increasingly problematic due to excessive erosion of the resist during the etching step needed for pattern transfer. Additionally, the desire to use lower energy e-beam imaging tools (e.g., 10 KeV tools) generally means that the resist layer must be thinner to be imaged by the lower energy beam. Thus, there is a need for improved processes for making patterned metal and/or semiconductor features and especially for making lithographic masks containing patterned metal layers.

It would therefore be desirable to provide a resist composition that has all of the above-mentioned attributes.

SUMMARY OF THE INVENTION

Accordingly, to the present invention a highly sensitive, high resolution negative-tone resist compositions is provided.

In addition, resist compositions of the present invention exhibit high resistance to reactive ion etching in employing oxygen and/or chlorine. Furthermore, resist compositions of the present invention can be developed in aqueous base compositions.

More particularly, the negative-tone resist compositions of the present invention comprise:

(a) a silicon-containing polymer with pendant fused moieties selected from the group consisting of fused aliphatic moieties, homocyclic fused aromatic moieties, and heterocyclic fused aromatic moieties and sites for reaction with a crosslinking agent, (b) an acid-sensitive crosslinking agent, and (c) a radiation-sensitive acid generator.

Another aspect of the present invention relates to a method of forming a patterned material layer on a substrate. The method comprises:

(a) providing a substrate having a material layer on a surface, (b) providing a layer of resist over the material layer, the resist comprising:

(i) a silicon-containing polymer with pendant fused moieties selected from the group consisting of fused aliphatic moieties, homocyclic fused aromatic moieties, and heterocyclic fused aromatic moieties and sites for reaction with a crosslinking agent, (ii) an acid-sensitive crosslinking agent, and (iii) a radiation-sensitive acid generator;

(c) patternwise exposing the resist layer to imaging radiation, (d) removing portions of the resist layer not exposed in step (c) to create spaces in the resist layer corresponding to the pattern, and (e) removing portions of the material layer at the spaces.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

DESCRIPTION OF BEST AND VARIOUS MODES FOR CARRYING OUT INVENTION

The present invention relates to a high sensitivity, high resolution, aqueous base developable silicon-containing negative-tone resist composition. The resist compositions of the present invention comprise (a) silicon-containing polymer with pendant fused moieties selected from the group consisting of fused aliphatic moieties, homocyclic fused aromatic moieties, and heterocyclic fused aromatic moieties, (b) acid-sensitive crosslinking and (c) radiation-sensitive acid generator.

The silicon-containing polymer may be a polymer containing SiO moieties in the polymer backbone and/or in pendant groups. Preferably, the polymer contains SiO moieties in its backbone. The polymer is preferably an organosiloxane, more preferably organosilsesquioxane. The polymer should have solution and film-forming characteristics conducive to forming a layer by conventional spin-coating. In addition, the SiO-containing polymer can contain a plurality of reactive sites distributed along the polymer for reaction with the crosslinking component.

Examples of suitable polymers include polymers having the silsesquioxane (ladder or network) structure. Such polymers preferably contain monomers having structures (I) and (II) below:

where $R_1$ comprises a chromophore and R2 comprises a reactive site for reaction with the crosslinking component.

Alternatively, general linear organosiloxane polymers containing monomers (III) and (IV) can be used:

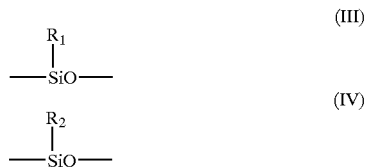

where $R_1$ and $R_2$ are as described above. In some cases, the polymer contain various combinations of monomers (I)–(IV) such that the average structure of $R_1$-containing monomers may be represented as structure (V) below and the average structure for $R_2$-containing monomers may be represented by structure (VI) below:

where x is from about 1 to about 1.5. In theory, x may be greater than 1.5, however, such composition generally do not possess characteristics suitable for spin-coating processes (e.g., they form undesirable gel or precipitate phases).

Generally, silsesquioxane polymers are preferred on the basis of superior etch resistance. If the ordinary organosiloxane polymers are used (e.g., monomers of structures (III) and (IV)), then preferably, the degree of crosslinking is increased by compared to formulations based on silsesquioxanes.

Preferably, the SiO-containing polymer (before grafting of the fused aromatic moieties) is poly(4-hydroxybenzylsilsesquioxane). Examples of other silsesquioxane polymers of the invention include:

poly(p-hydroxyphenylethylsilsesquioxane),
poly(p-hydroxyphenylethylsilsesquioxane-co-p-hydroxy-α-methylbenzylsilsesquioxane),
poly(p-hydroxyphenylethylsilsesquioxane-co-methoxybenzylsilsesquioxane),
poly(p-hydroxyphenylethylsilsesquioxane-co-t-butylsilsesquioxane),
poly(p-hydroxyphenylethylsilsesquioxane-co-cyclohexylsilsesquioxane),
poly(p-hydroxyphenylethylsilsesquioxane-co-phenylsilsesquioxane),
poly(p-hydroxyphenylethylsilsesquioxane-co-bicycloheptylsilsesquioxane), poly(p-hydroxy-α-methyl benzylsilsesquioxane),
poly(p-hydroxy-α-methylbenzylsilsesquioxane-co-p-hydroxybenzylsilsesquioxane),
poly(p-hydroxy-α-methylbenzylsilsesquioxane-co-methoxybenzylsilsesquioxane),
poly(p-hydroxy-α-methylbenzylsilsesquioxane-co-t-butylsilsesquioxane),
poly(p-hydroxy-α-methylbenzylsilsesquioxane-co-cyclohexylsilsesquioxane),
poly(p-hydroxy-α-methylbenzylsilsesquioxane-co-phenylsilsesquioxane),
poly(p-hydroxy-α-methylbenzylsilsesquioxane-co-bicycloheptylsilsesquioxane), and
poly(p-hydroxybenzylsilsesquioxane-co-p-hydroxyphenylethylsilsesquioxane).

The SiO-containing polymers typically have a weight average molecular weight, before reaction with the crosslinking component, of at least about 1000, more typically a weight average molecular weight of about 1000–10000.

Examples of suitable aromatic fused-ring moieties include anthracyl and phenathracyl.

The compounds containing the aromatic fused-rings also include a reactive group for grafting onto the silicon polymer such as reactive hydroxyl groups.

The aromatic fused-ring moieties may be chemically attached to the SiO containing polymer by acid-catalyzed O-alkylation or C-alkylation such as by Friedel-Crafts alkylation. Alternatively, the aromatic fused-ring moiety may be attached by an esterification mechanism. A preferred acid for Friedel-Crafts catalysis is HCl. The site for attachment of the aromatic fused-ring is preferably an aromatic group such as a hydroxybenzyl or hydroxymethlbenzyl group. Alternatively, the aromatic fused-ring may be attached by reaction with other moieties such as cyclohexanol or other alcohols. The reaction to attach the aromatic fused-ring is preferably an esterification of the alcoholic OH group.

Alternatively, the pendant fused moiety may be a heterocyclic aromatic moiety (e.g. containing S,N or O in a ring position) or a fused ring aliphatic moiety. Fused-ring aromatic moieties (homocyclic or heterocyclic) are preferred for ease of synthesis as indicated below. The aliphatic moiety may require more elaborate synthesis techniques (e.g., use of gringard reagents and/or hydrogenation).

The amount of the compound containing the fused moiety is preferably employed in amounts of about 5 to about 35 mole % and more preferably about of 5 to about 20 mole % based on the monomer units contained in the polymer.

The crosslinking component is preferably a crosslinker that can be reacted with the SiO containing polymer in a manner which is catalyzed by generating acid and/or by heating. Generally, the crosslinking component used in the compositions of the invention may be any suitable crosslinking agent known in the negative photoresist art which is otherwise compatible with the other selected components of the composition. The crosslinking agents preferably act to crosslink the polymer component in the presence of a generated acid. Preferred crosslinking agents- are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible crosslinking agents include: 2,6-bis(hydroxymethyl)-p-cresol, compounds having the following structures:

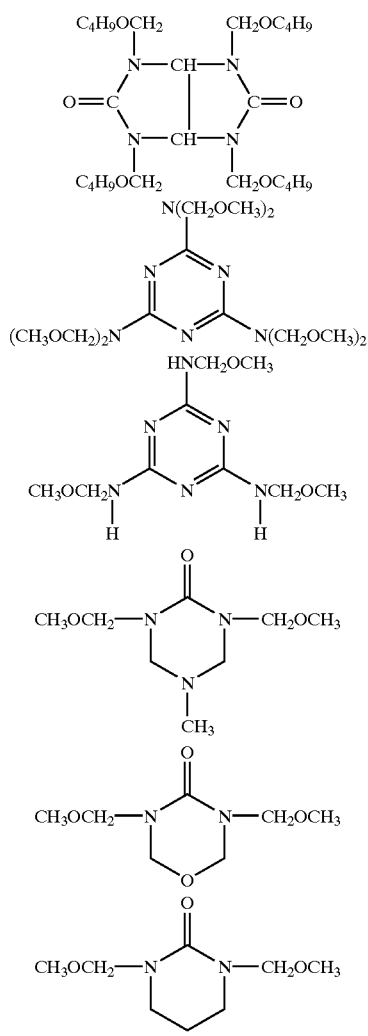

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1,204,547. Other crosslinking agents such as bis-epoxies or bis-phenols (e.g., bisphenol-A) may also be used. Combinations of crosslinking agents may be used.

The photo acid generator used in the resist formulation of the present invention are compounds which generate an acid upon exposure to energy. They are commonly employed herein as well as in the prior art to generate stable carbocations of the crosslinking agents for the crosslinking of the silicon-containing polymer resins. Illustrative classes of such acid generators that can be employed in the present invention include, but are not limited to: nitrobenzyl compounds, onium salts, sulfonates, carboxylates and the like. To minimize acid diffusion for high resolution capability, the acid generators should be such that they generate bulky acids upon exposure to energy. These bulky acids contain at least 4 carbon atoms. A preferred acid generator employed in the present invention is an onium salt such as an iodonium salt or a sulfonium salt. Examples of photoacid generators are discussed in great length in disclosure of which is incorporated herein by reference. More preferred acid generators are di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, and di(t-butylphenyl) iodonium camphoresulfonate.

The specific photoacid generator selected will depend on the irradiation being used for patterning the resist. Photoacid generators are currently available for a variety of different wavelengths of light from the visible range to the X-ray range; thus, imaging of the resist can be performed using deep-UV, extreme-UV, e-beam, laser or any other irradiation source deemed useful.

The compositions of the invention typically contain (on a solids basis) (i) about 50–98 wt. % of the SiO-containing polymer, more typically about 70–80 wt. %, (ii) about 1–50 wt. % of crosslinking component, more typically about 3–25%, most preferably about 5–25 wt. %, and (iii) about 0.1–20 wt. % acid generator, more typically about 0.5–15 wt. %.

Solvents that can be employed in the resist formulation of the present invention are solvents well known to those skilled in the art. They are used to dissolve the silicon-containing polymer, the crosslinking agent, the photoacid generator and other components. Illustrative examples of such solvents include, but are not limited to: ethers, glycol ethers, aromatic hydrocarbons, ketones, esters and the like.

Suitable glycol ethers that can be employed in the present invention include: 2-methoxyethyl ether (diglyme), ethylene glycol monomethyl ether, propylene glycol monomethyl ether, propylene glycol monoether acetate (PGMEA) and the like. Examples of aromatic hydrocarbons that may be employed in the present invention include toluene, xylene and benzene; examples of ketones include methylisobutylketone, 2-heptanone, cycloheptanone, and cyclohexanone; an example of an ether is tetrahydrofuran; whereas ethyl lactate and ethoxy ethyl propionate are examples of esters that can be employed in the present invention. Of the solvents mentioned hereinabove it is preferred that a glycol ether or ester be employed, with PGMEA being the most preferred glycol ether and ethyl lactate is the most preferred ester.

The compositions can also include optional components such as basic materials and surfactants.

The bases that can be employed in the present invention, include, but are not limited to: Coumarins, berberine, cetyltrimethylammonium hydroxide, 1,8-bis(dimethylamino) naphthalene, tetrabutyl ammonium hydroxide (TBAH), amines, polymeric amines and the like.

The surfactants that can be employed in the present invention as those that are capable of improving the coating homogeneity of the chemically amplified negative-tone resist compositions of the present invention. Illustrative examples of such surfactants include: fluorine-containing surfactants such as 3M's FC-430 and siloxane-containing surfactants such as Union Carbide's SILWET series and the like.

When the compositions contain a solvent such is typically present in amounts of about 40 to about 99.5 wt. % of the composition.

If a photosensitizer is present, it is preferably present in an amount of from about 0.001 to about 8 wt. %. When a base and/or surfactant are used, they are preferably present in an amount of from about 0.001 to about 16 wt. % of the base and from about 100 to about 1000 PPM wt. % of the surfactant. More typically, the negative-tone resist composition of the present invention comprises from about 0.5 to about 30 wt. % of the silicon resin component; from about 0.05 to about 20 wt. % of the crosslinking component; from about 0.005 to about 10 wt. % the acid generators from about 80 to about 98 wt. % of the solvent; and, if present, from about 50 to about 800 PPM wt % of a base, and from about 250 to about 1000 PPM wt. % of a surfactant.

In accordance with the present invention, the silicon-containing resist compositions can be used as an imaging layer in the manufacturing of semiconductor devices.

The silicon-containing imaging layer is applied usually by spin coating on the substrate, and baked to give a layer thickness typically about 50 to 400 nm, more typically about 100 to 300 nm. If desired it can be exposed to elevated temperatures of about 80° to about 140° C. to drive off the solvent. The imaging layer is exposed to an appropriate irradiation source. This is followed by post-exposure baking and development in an aqueous base developer, such as aqueous tetramethyl ammonium hydroxide (TMAH) solution.

The pattern from the resist structure may then be transferred to the material (e.g., ceramic, metal or semiconductor) of the underlying substrate. Typically, the transfer is achieved by reactive ion etching or some other etching technique. The most preferred application for the resist materials of the invention is in the patterning of metal layers, especially chromium-containing metal compositions as are commonly used for mask-making. In such applications, a halogen compound-containing pattern transfer etchant where the halogen is Cl, Br or I is typically used (e.g., $Cl_2$, $Br_2$, $I_2$, and $BCl_3$). The halogen compound-containing etchant may contain a combination of halogen compounds and/or may contain additional compounds such as a strong oxidant (e.g., $O_2$). A combination of $Cl_2$ and $O_2$ is a generally preferred etchant. The etching process described in U.S. Pat. No. 5,948,570 may be used except that no post-development oxidation step is required using the resist of the present invention. The disclosure of U.S. Pat. No. 5,948,570 is incorporated herein by reference. Other suitable etching techniques also may be used.

The compositions of the invention and resulting resist structures can be used to create other patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, pattern-wise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362, 663; 5,429,710; 5,562,801; 5,618,751; 5,744,376; 5,801, 094; 5,821,469, and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

The following non-limiting examples are given to further illustrate the present invention. Because these examples are given for illustrative purposes only, the invention embodied therein should not be limited thereto.

EXAMPLE 1

Onto about 15.9 g (0.1 mole) of poly(4-hydroxybenzylsilsesquioxane) is grafted about 15 mole % of 9-anthracene methanol by reacting in $CH_3CN$ employing HCl as a catalyst. The solution was heated to reflux conditions and neutralized with $NH_4OH$. The resulting grafted polymer was precipitated in water and dries overnight in vacuum at 40° C.

About 63 mg of triphenylphosphornium triflate is added to 3 g of the grafted polymer along with about 840 mg. of 0.5 wt. % of tetrabutyl ammonium hydroxide (TBAH) in propylene glycol monoethylacetate (PGMEA); about 240 mg of Powderlink; about 19.22 g of propylene glycol monoethylacetate (PGMEA); and about 30 mg of FC 430 surfactant.

The above composition is spun onto a substrate and heated to about 110° C. The composition is then imagewise exposed to electron beam. It provides resolution of 150 nanometers L/S at 16 $\mu C/cm^2$ using a VS-6 50 KV e-beam exposure system. The composition is then subjected to be a post expose bake at about 110° C. and developed in 0.263 N TMAH developer.

EXAMPLE 2

Example 1 is repeated except that the graft polymer is from about 20 mole % of anthracene methanol. The composition provides resolution of 100 nanometers lines (L/S 1:2) at 19 $\mu C/cm^2$.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A negative resist composition, comprising:
    (a) a silicon-containing polymer with pendant fused moieties selected from the group consisting of fused aliphatic moieties, homocyclic fused aromatic moieties, and heterocyclic fused aromatic and sites for reaction with a crosslinking agent,
    (b) an acid-sensitive crosslinking agent, and
    (c) a radiation-sensitive generator.
2. The resist composition of claim 1 where the silicon containing polymer comprises silsesquioxane-containing monomers.
3. The resist composition of claim 1 where the fused moieties comprise anthracene moieties.
4. The resist composition of claim 1 wherein the silicon containing polymer is a poly(4-hydroxybenzylsilsesquioxane).
5. The resist composition of claim 1 wherein said composition contains, on a solids basis, about 50–98 wt. % of (a), about 1–50 wt. % of (b), and about 1–20 wt. % of (c).
6. The resist composition of claim 1 wherein the acid catalyzable crosslinking agent is selected from the group consisting of tetramethoxymethyl glycouril, methylpropyl tetramethoxymethyl glycouril and methylphenyl tetramethoxy methyl glycouril.
7. The resist composition of claim 1 wherein the acid generator is at least one compound selected from the group consisting of nitrobenzyl compounds, onium salts, sulfonates and carboxylates, and wherein the acid generator is capable of generating a bulky acid containing at least 4 carbon atoms.
8. The resist composition of claim 1 wherein the acid generator is at least one compound selected from the group consisting of di(t-butylphenyl)iodonium perfluorobutane sulfonate, di(t-butylphenyl)iodonium perfluorohexane sulfonate, di(t-butylphenyl)iodonium perfluorooctane sulfonate, di(t-butylphenyl)iodonium perfluorooctane sulfonate, di(t-butylphenyl)iodonium perfluoroethylcyclohexane sulfonate, and di(t-butylphenyl)iodonium camphoresulfonate.
9. The resist composition of claim 1 wherein further contains a solvent (d).
10. The resist composition of claim 9 wherein further contains a base (e) and a surfactant (f).
11. The resist composition of claim 10 wherein the resist composition comprises from about 0.1 to about 50 wt. % of component (a); from about 0.005 to about 40 wt. % of component (b); from about 0.001 to about 14 wt. % of component (c); and from about 40 to about 99.5 wt. % of component (d); from about 0.001 to about 8 wt. % component (e); from about 0.001 to about 16 wt. % of component (f); and from about 100 to about 1000 PPM wt. % of component (g).
12. The resist composition of claim 11, which comprises from about 0.5 to about 30 wt. % of component (a); from about 0.05 to about 20 wt. % of component (b); from about 0.005 to about 10 wt. % of component (c); from about 80 to about 98 wt. % of component (d); and, if present, from about 0.002 to about 2 wt. % of component (e), from about 50 to about 800 PPM wt. % of component (f), and from about 250 to about 1000 PPM wt. % of component (g).
13. The resist composition of claim 9 wherein the solvent is at least one compound selected from the group consisting of ethers, glycol ethers, aromatic hydrocarbons, lactones and esters.
14. The resist composition of claim 10 wherein the base is at least one compound selected from the group consisting of coumarin, berberine, cetyltrimethylammonium hydroxide, 1,8-bis(dimethylamine)-naphthalene, tetrabutyl ammonium hydroxide, amines and polymeric amines.
15. The resist composition of claim 10 wherein the surfactant is a fluorine-containing surfactant or a siloxane-containing surfactant.
16. The resist composition of claim 1 which further contains a base (e).

* * * * *